(12) United States Patent
Zimmanck

(10) Patent No.: US 9,013,171 B2
(45) Date of Patent: Apr. 21, 2015

(54) METHOD AND APPARATUS FOR DETECTING A ZERO-VOLTAGE CONDITION ACROSS FOUR QUADRANT SWITCHES

(71) Applicant: Enphase Energy, Inc., Petaluma, CA (US)

(72) Inventor: Donald Richard Zimmanck, Petaluma, CA (US)

(73) Assignee: Enphase Energy, Inc., Petaluma, CA (US)

(*) Notice: Subject to any disclaimer, the term of this patent is extended or adjusted under 35 U.S.C. 154(b) by 217 days.

(21) Appl. No.: 13/668,970

(22) Filed: Nov. 5, 2012

(65) Prior Publication Data

US 2013/0176032 A1    Jul. 11, 2013

Related U.S. Application Data

(60) Provisional application No. 61/555,225, filed on Nov. 3, 2011.

(51) Int. Cl.
| | | |
|---|---|---|
| *G01R 19/00* | (2006.01) | |
| *G01R 31/327* | (2006.01) | |
| *G01R 19/155* | (2006.01) | |
| *H02M 1/08* | (2006.01) | |

(52) U.S. Cl.
CPC ............ *G01R 31/327* (2013.01); *G01R 19/155* (2013.01); *H02M 1/083* (2013.01)

(58) Field of Classification Search
CPC .................... H02M 1/4208; H02M 2001/0012; H02M 2001/009; H02M 3/156; H02M 3/1588; H02M 3/33569; H02M 1/38; H02M 2001/0058; H02M 7/5387; G01R 31/02; G01R 31/327; G01R 33/3852; G05B 17/02; G05B 1/03
See application file for complete search history.

(56) References Cited

U.S. PATENT DOCUMENTS

| | | | | |
|---|---|---|---|---|
| 5,153,513 | A | * | 10/1992 | Adachi ................ 324/207.25 |
| 5,428,522 | A | * | 6/1995 | Millner et al. .................. 363/63 |
| 2007/0247091 | A1 | * | 10/2007 | Maiocchi ...................... 318/254 |
| 2009/0146730 | A1 | | 6/2009 | Chen |

FOREIGN PATENT DOCUMENTS

| | | |
|---|---|---|
| CN | 101882927 | 11/2010 |
| SU | 1758747 | 8/1992 |

OTHER PUBLICATIONS

U.S. Appl. No. 13/720,602, Donald Richard Zimmanck.
U.S. Appl. No. 61/579,462, Donald Richard Zimmanck.
International Search Report and Written Opinion dated Feb. 14, 2013 for PCT Application No. PCT/US2012/063565, 6 pages.

* cited by examiner

*Primary Examiner* — Vinh Nguyen
(74) *Attorney, Agent, or Firm* — Moser Taboada

(57) ABSTRACT

A method and apparatus for detecting a zero-voltage condition. In one embodiment, the method comprises generating a first current that is proportional to a voltage across a four-quadrant (4Q) switch; generating a reference current, wherein the reference current is equal to a value of the first current when of the voltage across the 4Q switch is at a predefined value; comparing the first current to the reference current; and generating an indication of a zero-voltage condition across the 4Q switch when the first current is less than the reference current.

20 Claims, 3 Drawing Sheets

METHOD AND APPARATUS FOR DETECTING A ZERO-VOLTAGE CONDITION ACROSS FOUR QUADRANT SWITCHES

CROSS-REFERENCE TO RELATED APPLICATIONS

This application claims benefit of U.S. provisional patent application Ser. No. 61/555,225, filed Nov. 3, 2011, which is herein incorporated in its entirety by reference.

BACKGROUND

1. Field of the Invention

Embodiments of the present invention generally relate to voltage detection techniques and, more particularly, to a method and apparatus for detecting a zero-voltage condition across four-quadrant switches.

2. Description of the Related Art

There are circuit topologies for power conversion which use zero voltage switching (ZVS) as a technique for reducing switching losses and thus improving efficiency. There are topologies emerging which use four-quadrant (4Q) switches operating with ZVS. 4Q switches conduct either polarity of current and block either polarity of voltage, and are commonly composed of two MOSFET switches connected in series with a common-source configuration. The ZVS transitions can be quite fast (e.g., tens of nanoseconds (ns)) and efficiency can be lost if a switch is not turned on at the appropriate time. Thus the circuit needs to detect when the voltage across a switch is relatively close to zero volts in a very fast manner.

Zero-voltage detectors in use today are limited to functioning over fixed and low voltage ranges and are not able to trigger at certain voltage levels. Often, these zero-voltage detectors only function with one polarity of voltage. A simple way of detecting zero-voltage transition used in the market involves a voltage comparator device. For example, a 4Q switch made of two switches in series connected to a common point (a local ground) may be connected to voltage dividers going to a voltage comparator in order to detect a zero-voltage condition across the 4Q switch. The resistors in the voltage dividers must have high resistances, otherwise a large amount of current will flow through causing power dissipation. However, the high resistance values coupled with intrinsic capacitance of the device itself create a low-pass filter, reducing the detection speed of the zero-voltage detector significantly. Thus the detector's usefulness is decreased in applications where voltage transitions occur very rapidly. In addition, zero-voltage detectors which are able to detect fast switching are often component heavy and consume excessive power.

Therefore, there is a need in the art for a faster and more efficient method and apparatus for detecting zero-voltage conditions across four quadrant switches.

SUMMARY

Embodiments of the present invention relate to a method and apparatus for detecting a zero-voltage condition. In one embodiment, the method comprises generating a first current that is proportional to a voltage across a four-quadrant (4Q) switch; generating a reference current, wherein the reference current is equal to a value of the first current when of the voltage across the 4Q switch is at a predefined value; comparing the first current to the reference current; and generating an indication of a zero-voltage condition across the 4Q switch when the first current is less than the reference current.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Figure 1:
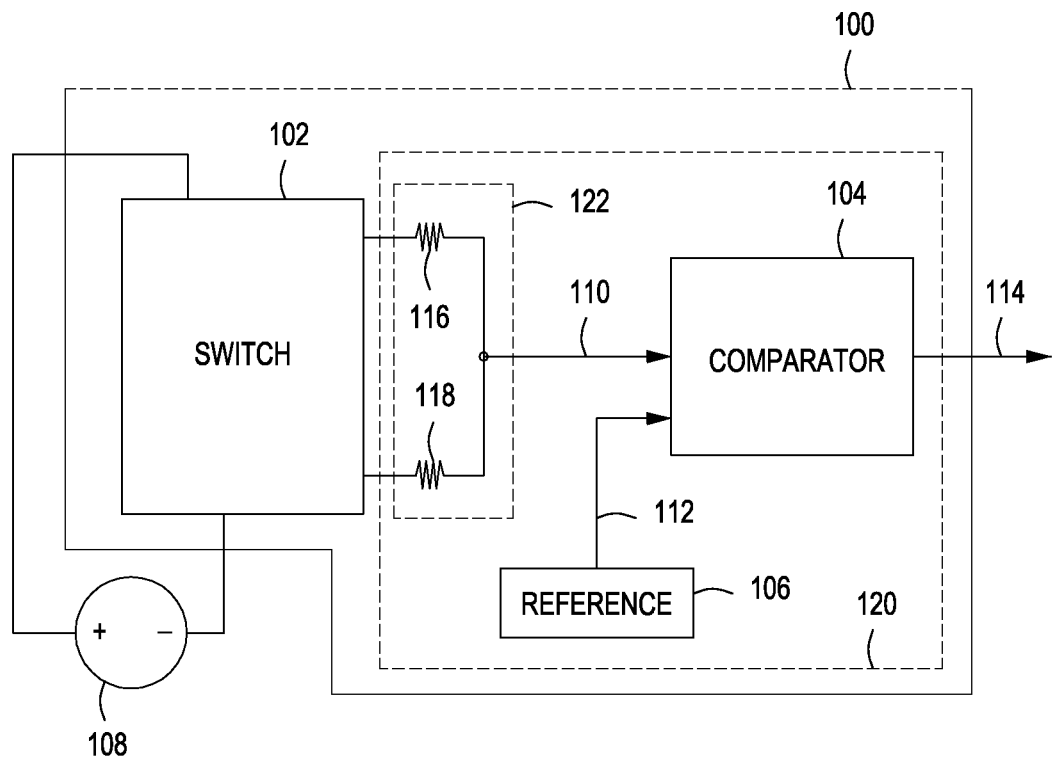
FIG. 1 is a block diagram depicting an apparatus for detecting a zero-voltage condition across four-quadrant switches in accordance with at least one embodiment of the invention.

FIG. 1 is a block diagram depicting an apparatus 100 for detecting a zero-voltage condition in accordance with at least one embodiment of the invention. The apparatus 100 comprises a four-quadrant (4Q) switch 102, a comparator 104, a resistive circuit 122, and a reference current generator 106, which generates a reference current 112. A voltage is applied across the switch 102 by power source 108. The 4Q switch outputs a current 110 via the resistive circuit 122, which is coupled across the output of the 4Q switch 102. The comparator 104 accepts two inputs and compares the two inputs; the comparator 104 then outputs a binary value on an output 114 based on which input is greater. As the value of one comparator input changes and passes the value of the other comparator input, the output 114 changes. In an exemplary embodiment, the comparator 104 has an intrinsic hysteresis to prevent the output 114 from fluctuating up and down when the two input values are almost equal.

The first input for the comparator 104 is the output current 110 of the switch 102 and the second input is the reference current 112 of the reference current generator 106. Thus, comparator 104 compares the current 110 coming from the switch 102 and the reference current 112 coming from the reference current generator 106 and outputs a value (i.e., the output 114) based on the comparison. As described in detail below, the output 114 indicates when there is a zero-voltage condition across the switch 102—i.e., when the voltage 108 is at zero or proximate zero volts—so that the switch 102 can be operated with zero voltage switching (ZVS).

The switch 102 is coupled to the resistive circuit 122, which comprises resistors 116 and 118 connected in series with each other; i.e., first terminals of the resistors 116 and 118 are coupled across the switch 102, and second terminals of the resistors 116 and 118 are coupled to one another and to the comparator 104 for providing the current 110 to the comparator 104. The resistors 116 and 118, the reference current generator 106, and the comparator 104 comprise a zero-voltage detection device 120 for indicating when a zero-voltage condition across the switch 102.

In an exemplary embodiment, the comparator 104 outputs logic level voltages (DIGITAL). With most discrete logic, this is 3.3V (referred to as 3.3V logic) for a logical high. In other embodiments, the comparator 104 outputs a different voltage level for indicating a logical high, such as 2.5V, 1.5V, or the like. In the present invention, the output voltage is dependent on the voltage that the digital circuitry is configured for. In an exemplary embodiment, when the logic of the comparator 104 goes low, the output of the comparator 104 is less than 100 mV, i.e., close to zero. In exemplary embodiments, the comparator 104 is configured such that a low voltage output is "true" and a high voltage output is "false", and in other embodiments, vice versa. For example, in one embodiment, when the current on a first input of comparator 104 becomes less than the current on a second input of comparator 104 (i.e., a zero-voltage condition across the switch 102 is detected), a low voltage is output; when the current on the first input of comparator 104 exceeds the current on the second input of comparator 104, a high voltage is output. The present invention does not limit in any way the logical behavior of the comparator 104 and its output.

Figure 2:
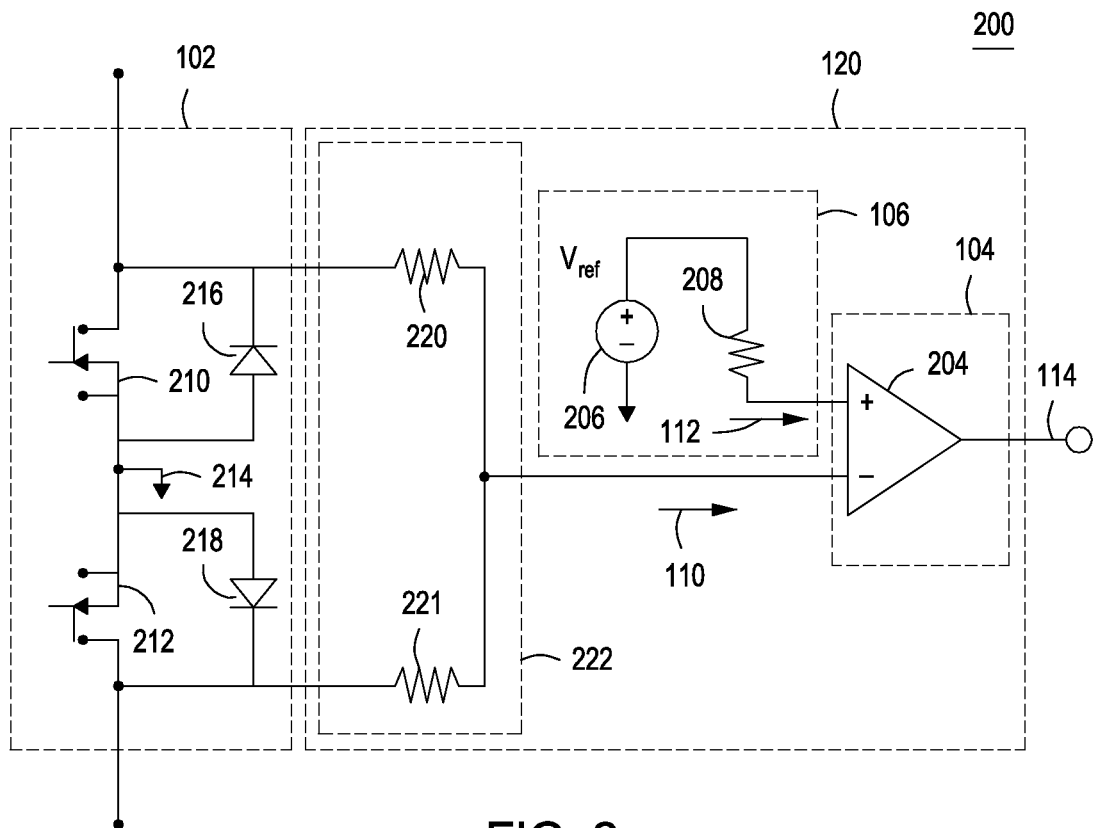
FIG. 2 is a circuit diagram depicting an implementation of the apparatus in FIG. 1 in accordance with at least one embodiment of the invention.

FIG. 2 is a circuit diagram depicting a circuit implementation 200 of the apparatus 100 in FIG. 1 in accordance with at least one embodiment of the invention. The circuit 200 comprises the switch 102, the comparator 104, a resistive circuit 222, and the reference current generator 106. In an exemplary embodiment, the reference current generator 106 is comprised of a reference voltage source 206 and a reference voltage resistor 208, connected in series to a non-inverting input to the comparator 104. In other embodiments, the reference current generator 106 is comprised of a bandgap current reference. In an exemplary embodiment, a bandgap current reference circuit is integrated on a comparator chip which generates a temperature-compensated current reference. In this exemplary embodiment, the comparator only requires one input.

According to an exemplary embodiment, the switch 102 is a 4Q switch comprised of a first switch 210 connected in series to a second switch 212. The sources of the first switch 210 and the second switch 212 are connected to a common reference point 214, considered a local ground. In some embodiments, the switches 210 and 212 are n-channel metal-oxide-semiconductor field-effect transistors (MOSFETS), although in other embodiments other types of switches are used. A first body diode 216 is connected in parallel to the switch 210 and a second body diode 218 is connected in parallel to the second switch 212 such that anode terminals of the body diodes 216 and 218 are coupled to the common reference point 214. Generally, the body diodes 216 and 218 are intrinsic.

The resistive circuit 222 comprises resistor 220 connected in series to resistor 221, and the series combination of the resistors 220 and 221 is connected in parallel to the switches 210 and 212; i.e., first terminals of the resistors 220 and 221 are coupled to drain terminals of the switches 210 and 212, respectively, and second terminals of the resistors 220 and 221 are coupled to one another and to an inverting input of the comparator 104 for providing the current 110 to the comparator 104.

Resistive circuit 222 (i.e., resistors 220 and 221) along with the reference current generator 106 and the comparator 104 comprise the zero-voltage detection device 120. In an exemplary embodiment, resistors 220 and 221 have an equal resistance value that is relatively large in comparison to resistor 208, although in other embodiments, the resistance values depend on the amplitude of the reference voltage. In some embodiments, resistor 208 is larger than resistors 220 and 221. For example, in one embodiment, resistors 220 and 221 are 1 megaohm (MΩ) resistors, Vref is 3.0V, and it is desired to have the trigger occur when the voltage across the switch 102 is less than 10V. When the voltage across the switch 102 is at 10V, the current 110 will be 10V/1 MΩ, or 10 microamps (µA). In order to generate the reference current 112 at 10 µA so that the comparator 114 will trigger when the current 110 drops below 10 µA, the resistor 208 must be 3.0V/10 µA, or, 300 kΩ.

According to an exemplary embodiment, the comparator 104 is a current comparator, referred to as a Norton comparator, that accepts two input currents and produces a binary output voltage based on which input has a higher value.

Figure 3:
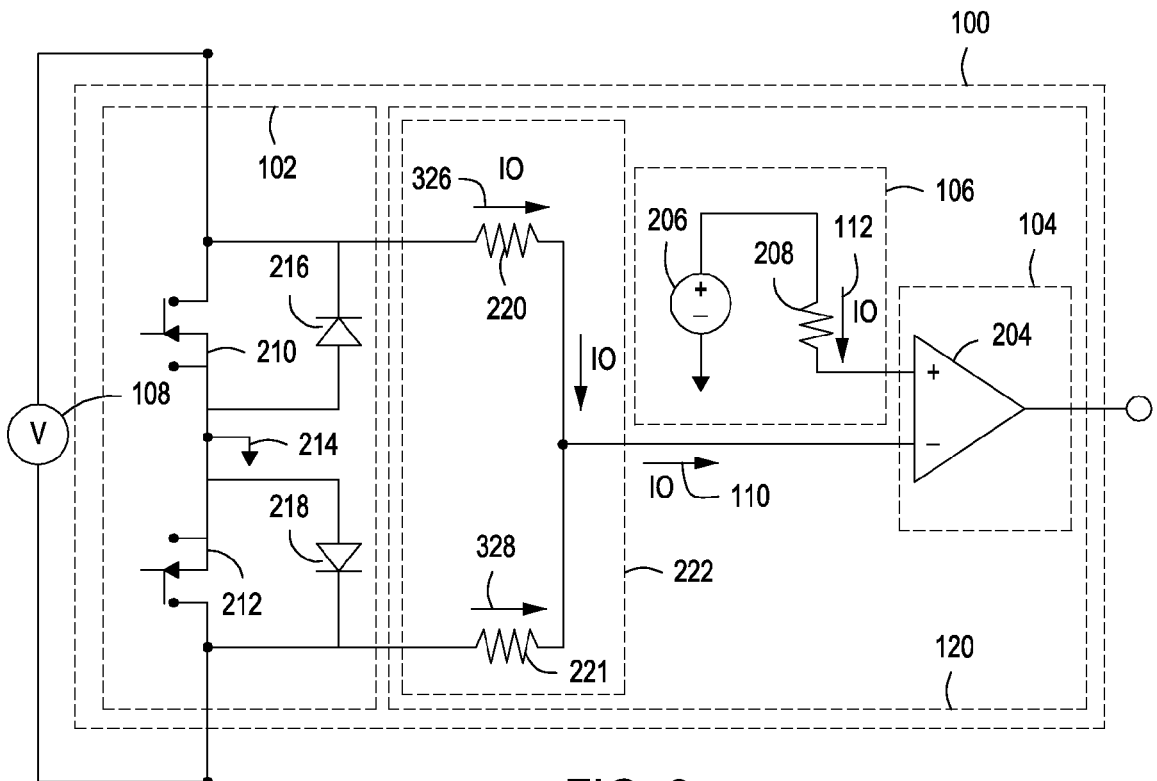
FIG. 3 illustrates a current flow diagram in the apparatus of FIG. 1 in accordance with at least one embodiment of the invention.

FIG. 3 illustrates a current flow diagram in the circuit implementation 200 as depicted in FIG. 2 and described above in accordance with at least one embodiment of the invention. Voltage source 108 provides voltage across 4Q switch 102 and is positioned with positive polarity. When the source 108 provides a positive voltage, the switch 212 and the body diode 218 have zero volts across them, because either the switch 212 is maintained in the "ON" position or because leakage current from the switch 210 causes the body diode 218 to conduct a current. When the switch 210 is "off", a positive current 326 flows across resistor 220 and is input as the current 110 into the inverting input of the comparator 204.

The reference current 112 coupled to the non-inverting input of the comparator 204 is fixed based on the voltage settings for the reference voltage source 206 and the reference resistor 208. As the voltage from the voltage source 108 decreases, the current 326 through resistor 220 decreases and eventually becomes less than the value of the reference current 112, causing the output of the comparator 204 to change and thereby indicate a zero-voltage condition across the switch 102 (i.e., that the voltage across the switch 102 is zero or proximate to zero volts).

In another example, the voltage source 108 provides a negative voltage. The switch 210 and the body diode 216 then have zero volts across them because either the switch 210 is maintained in the "ON" position, as opposed to the switch 212 maintained in the "ON" position as discussed above, or leakage current from the switch 212 causes the body diode 216 to conduct. This causes a positive current 328 to flow across resistor 221 when the switch 212 is "OFF", which is then coupled as the current 110 to the inverting input of the comparator 204. As the voltage from the voltage source 108 increases toward zero (i.e., as the absolute value of the voltage source voltage decreases), the current 328 through resistor 221 decreases and eventually becomes less than the reference current 112, causing the output of the comparator 204 to change and thereby indicate a zero-voltage condition across the switch 102 (i.e., that the voltage across the switch 102 is zero or proximate to zero volts). In this manner, the comparator 204 determines whether the voltage across the 4Q switch 102 has transitioned either to zero or to a value relatively close to zero considering a previous voltage; e.g., if the voltage 108 was initially at −100V and has increased to −10V, −10V may effectively be considered a zero-voltage condition.

Regardless of the polarity of the voltage across the 4Q switch 102, positive current 110 flows through to the comparator 204. Thus, a zero-voltage condition is detectable at both negative and positive voltage transitions, within trigger values as determined by component design choices. By activating the 4Q switch 102 when the voltage across it is zero volts or proximate to zero volts, there are significantly lower switching losses and less stress on the switch 102. For example, if the desired trigger to activate the switch 102 is when the voltage 108 is 20V, the zero-voltage detection device components may be selected such that the reference voltage source 206 is at 10V, the resistors 220 and 221 are each 2 MΩ resistors, and the reference resistor 208 is a 1 MΩ resistor. Such component selection results in the desired trigger level, which is equal to the voltage of the reference voltage source 206 (Vref) multiplied by the ratio of the resistance of resistor 220 and resistor 208 (R220/R208), i.e., Vref*R220/R208=10V*2 MΩ/1 MΩ=20V. Since the resistors 220 and 221 are equal in value, the zero-voltage detection device 120 will also trigger when the voltage 108 is −20V. Therefore, the zero-voltage detection device 120 works for voltages across the switch 102 having positive and negative polarity. In other exemplary embodiments, one or more of Vref, R220, R221 and R208 are variable in order to trigger at a voltage other than 20V or −20V across the 4Q switch 102.

Figure 4:
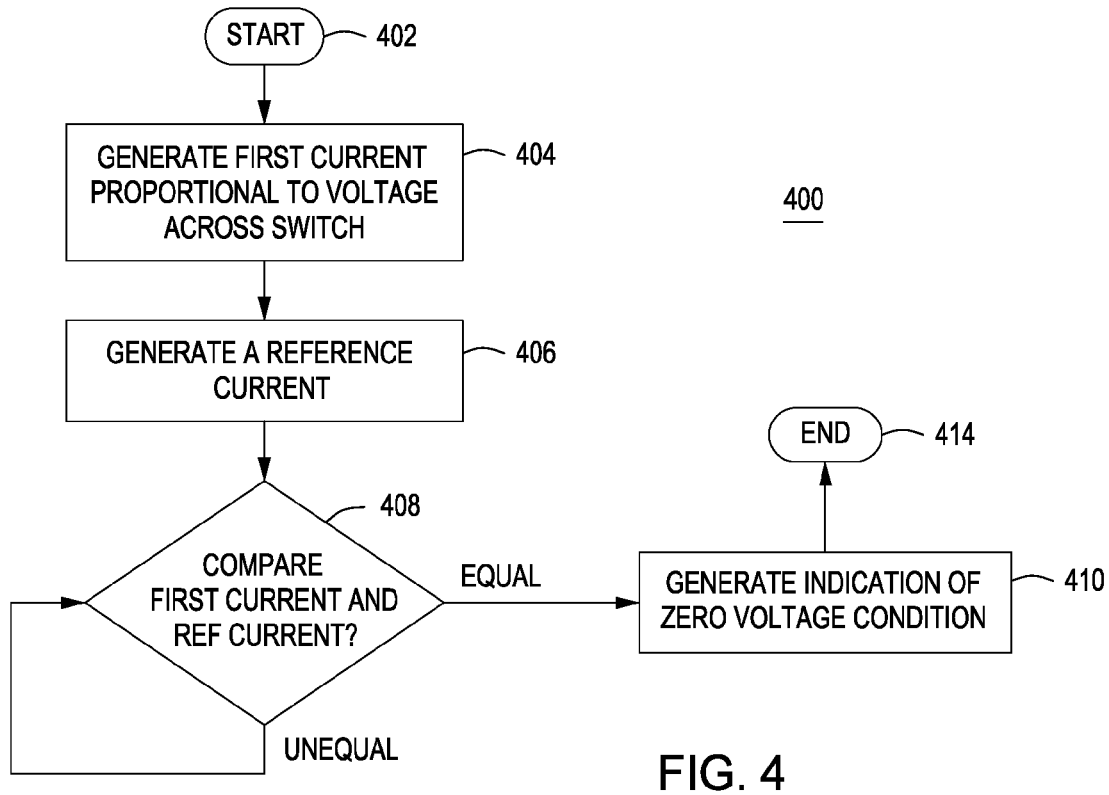
FIG. 4 is a flow diagram depicting operation of the apparatus in FIG. 2 for detecting a zero-voltage condition across four-quadrant switches in accordance with at least one embodiment of the invention.

FIG. 4 is a flow diagram of a method 400 depicting operation of the apparatus 100 in FIG. 1 for detecting a zero-voltage condition across four-quadrant switches in accordance with at least one embodiment of the invention. The method 400 begins at step 402 and proceeds to step 404. At step 404, a first current is generated proportional to an absolute value of the voltage across a four-quadrant (4Q) switch. In some embodiments, the first current may be generated by coupling a resistive circuit across the 4Q switch, where the resistive circuit comprises a series combination of two equal-valued resistors coupled across the 4Q switch (e.g., the switch 102/resistive circuit 222 that generates the current 110). At step 406, a reference current is generated having a fixed value. The reference current value is equal to or slightly higher than what the value of the first current will be when the absolute value of the voltage across the 4Q switch is at a desired level, or trigger voltage, to indicate a zero-voltage condition across the switch (i.e., when the voltage across the switch is zero or proximate zero volts). For example, the trigger voltage may be zero volts or may be another voltage proximate to zero volts, such as 10V or 20V. In some embodiments, the reference current may be generated by determining a suitable trigger voltage, determining what the value of the first current will be when the voltage across the 4Q switch is at the trigger voltage, and using a reference voltage source and a reference resistance selected to generate a current having such a value (e.g., the reference voltage source 206 and the reference resistor 208).

At step 408, the first current and the reference current are compared; for example, the currents may each be coupled to a current comparator that produces a binary output based on which current in greater, e.g., the comparator 204 which in certain embodiments may be a Norton comparator. If the first current drops below the reference current, for example as determined by the current comparator, the method 400 proceeds to step 410. At step 410, an indication that a zero-voltage condition exists is generated, e.g., an output from the current comparator may change in value. If, at step 408, it is determined that the value of the first current has not fallen below the reference current value, then the method 400 returns to step 408. In this manner, an indication will be generated when the first current falls below the reference current, thereby indicating a zero-voltage condition across the 4Q switch such that the 4Q switch can be switched, minimizing switching loss. In an exemplary embodiment, the first current will drop below the reference current when the voltage across the 4Q switch reaches a predetermined value proximate zero, such as 10V or the like. In some embodiments, the zero-voltage condition is indicated when the first current is less than the reference current; in other embodiments, the zero-voltage condition is indicated when the first current is less than or equal to the reference current.

In some exemplary embodiments, the present invention is used for detecting zero-voltage conditions across 4Q switches of a resonant converter cycloconverter, such as the cycloconverter disclosed in commonly assigned patent application Ser. No. 61/579,462, entitled "METHOD AND APPARATUS FOR TRANSMITTING COMBINED POWER, CONTROL AND DATA THROUGH AN ISOLATION BARRIER", filed Dec. 22, 2011, which is herein incorporated in its entirety by reference.

Figure 5:
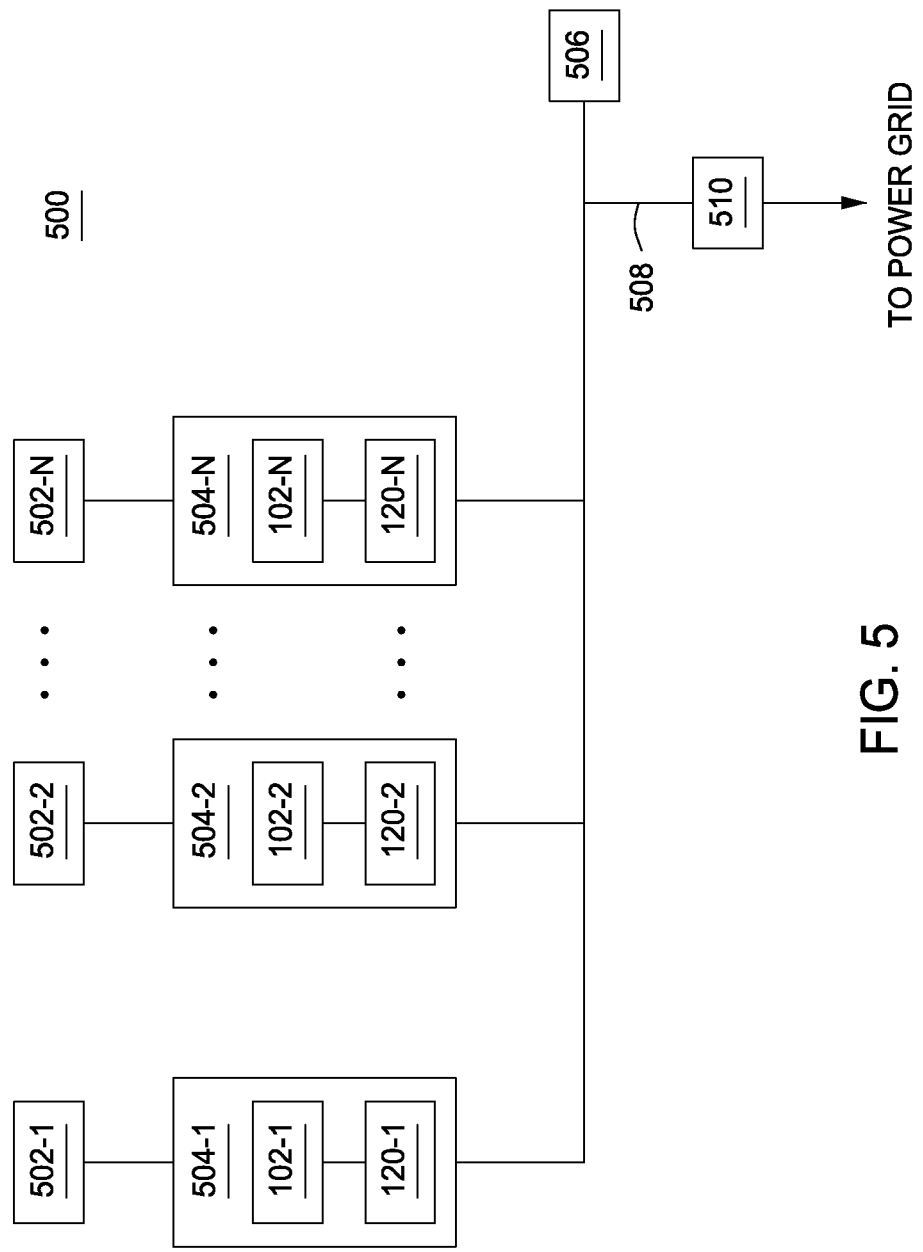
FIG. 5 is a block diagram of a system for generating power in accordance with one or more embodiments of the present invention.

FIG. 5 is a block diagram of a system 500 for generating power in accordance with one or more embodiments of the present invention. This diagram only portrays one variation of the myriad of possible system configurations and devices that may utilize the present invention. The present invention can be utilized in any system or device having a four-quadrant (4Q) switch where an indication of a zero-voltage condition (i.e., zero or approximately zero volts) across the 4Q switch is desired, for example for using zero voltage switching (ZVS). In some embodiments, the present invention may be used in systems or devices for power conversion, such as DC/DC converters, DC/AC inverters, AC/DC inverters, or the like. In some embodiments, such as the embodiment described below, the system 500 comprises a plurality of DC/AC inverters for inverting DC power, received from solar photovoltaic (PV) modules, to AC power. Additionally or alternatively, the system 500 may convert DC power from other DC power sources, such as other types of renewable energy sources (e.g., wind, hydroelectric, or the like), batteries, and the like. In other embodiments, the system 500 may comprise DC/DC converters, rather than DC/AC inverters, for converting the received solar energy to DC power.

The system 500 comprises a plurality of power converters, which are inverters 504-1, 504-2 . . . 504-N, collectively referred to as inverters 504; a plurality of PV modules 502-1, 502-2 . . . 502-N, collectively referred to as PV modules 502; a power conversion system controller 506; an AC bus 508; and a load center 510.

Each inverter 504-1, 504-2 . . . 504-N is coupled to a PV module 502-1, 502-2 . . . 502-N, respectively, in a one-to-one correspondence. The inverters 504 are further coupled to the power conversion system controller 506 via the AC bus 508. The power conversion system controller 506 is capable of communicating with the inverters 504 for providing operative control of the inverters 504. In some embodiments, the power conversion system controller 506 may be a monitor for monitoring the inverters 504; additionally or alternatively, the power conversion system controller 506 may be a networking hub for communicatively coupling the inverters 504 to the Internet. The inverters 504 are also coupled to the load center 510 via the AC bus 508.

The inverters 504 convert DC power generated by the PV modules 502 to commercial power grid compliant AC power and couple the AC power to the load center 510. The generated AC power may be further coupled from the load center 510 to one or more appliances and/or to a commercial power grid. Additionally or alternatively, generated energy may be stored for later use; for example, the generated energy may be stored utilizing batteries, heated water, hydro pumping, $H_2O$-to-hydrogen conversion, or the like. In some embodiments, DC/DC converters may be coupled between each inverter 504 and the corresponding PV module 502 (i.e., one DC/DC converter per inverter 504). In some other embodiments, the PV modules 502 may all be coupled to a single inverter 504 for inverting the DC power to AC power (i.e., a centralized DC/AC inverter). In still other embodiments, the inverters 504 may be another type of power converter, such as DC/DC converters or DC/AC inverters.

Each of the inverters 504 comprises a 4Q switch 102 coupled to a zero-voltage detection device 120 (i.e., the inverters 504-1, 504-2, ... 504-N comprise the switches/zero-voltage detection devices 102-1/120-1, 102-2/120-2 ... 102-N/120-N, respectively). In some embodiments, one or more of the inverters 504 may have more than a single switch 102/zero-voltage detection device 120; additionally or alternatively, the inverters 504 may comprise the 4Q switch 102 while the corresponding zero-voltage detection device is an external element coupled to the switch 102.

As previously described, each of the zero-voltage detection devices 120 determines whether the voltage across the corresponding 4Q switch 102 has transitioned either to zero or to a value relatively close to zero considering a previous voltage; for example, if the voltage across the switch transitions from −100V to −10V, then −10V may effectively be considered a zero-voltage condition. The zero-voltage detection device 120 generates an indication of such a zero-voltage condition across the switch 102, which may then be used to trigger switching to occur for the switch 102.

The foregoing description, for purpose of explanation, has been described with reference to specific embodiments. However, the illustrative discussions above are not intended to be exhaustive or to limit the invention to the precise forms disclosed. Many modifications and variations are possible in view of the above teachings. The embodiments were chosen and described in order to best explain the principles of the present disclosure and its practical applications, to thereby enable others skilled in the art to best utilize the invention and various embodiments with various modifications as may be suited to the particular use contemplated.

Further, the foregoing description of embodiments of the invention comprises a number of elements, devices, circuits and/or assemblies that perform various functions as described. For example, the comparator 104 is one example of a means for comparing two currents, the resistive circuit 222 is one example of a means for generating a current that is proportional to an absolute value of the voltage across a 4Q switch, and the reference current generator 106 is one example of a means for generating a reference current having a certain value. These elements, devices, circuits, and/or assemblies are exemplary implementations of means for performing their respectively described functions.

Various elements, devices, and modules are described above in association with their respective functions. These elements, devices, and modules are considered means for performing their respective functions as described herein.

While the foregoing is directed to embodiments of the present invention, other and further embodiments of the invention may be devised without departing from the basic scope thereof.

The invention claimed is:

1. An apparatus for detecting a zero-voltage condition, comprising:
   a comparator;
   a resistive circuit, coupled across a four-quadrant (4Q) switch and to a first input of the comparator for providing a first current to the comparator; and
   a current generator, coupled to a second input of the comparator, for providing a reference current to the comparator, wherein the comparator generates an indication of a zero-voltage condition across the 4Q switch when the first current is less than the reference current.

2. The apparatus of claim 1, wherein the first current is proportional to an absolute value of a voltage across the 4Q switch.

3. The apparatus of claim 1, wherein the comparator is a Norton comparator.

4. The apparatus of claim 1, wherein the resistive circuit comprises a series combination of a first resistor and a second resistor, wherein the first and the second resistors are equal in value.

5. The apparatus of claim 1, wherein the current generator comprises a reference voltage source coupled in series to a resistor.

6. The apparatus of claim 1, wherein the current generator comprises a bandgap current reference.

7. The apparatus of claim 1, wherein the resistive circuit comprises a first resistor and a second resistor, and wherein a first terminal of the first resistor is coupled to a first terminal of the second resistor and to a first input of the comparator, and wherein the current generator comprises a reference voltage source and a reference resistor, and wherein a first terminal of the reference resistor is coupled to the reference voltage source and a second terminal of the resistor is coupled to a second input of the comparator.

8. A method for detecting a zero-voltage condition, comprising:
   generating a first current that is proportional to a voltage across a four-quadrant (4Q) switch;
   generating a reference current, wherein the reference current is equal to a value of the first current when of the voltage across the 4Q switch is at a predefined value;
   comparing the first current to the reference current; and
   generating an indication of a zero-voltage condition across the 4Q switch when the first current is less than the reference current.

9. The method of claim 8, wherein the predefined value is proximate zero volts.

10. The method of claim 8, wherein the first current is proportional to an absolute value of the voltage across the 4Q switch.

11. The method of claim 8, wherein the first current and the reference current are compared by a current comparator.

12. The method of claim 11, wherein the current comparator is a Norton comparator.

13. The method of claim 8, wherein the reference current is generated by a current generator comprising a reference voltage source coupled in series to a resistor.

14. The method of claim 8, wherein the reference current is generated by a current generator comprising a bandgap current reference.

15. A system for detecting a zero-voltage condition, comprising:
   a power converter comprising a four-quadrant (4Q) switch; and
   a zero-voltage detection device comprising (i) a comparator; (ii) a resistive circuit, coupled across the 4Q switch and to a first input of the comparator for providing a first current to the comparator; and (iii) a current generator, coupled to a second input of the comparator, for providing a reference current to the comparator, wherein the comparator generates an indication of a zero-voltage condition across the 4Q switch when the first current is less than the reference current.

16. The system of claim 15, wherein the first current is proportional to an absolute value of a voltage across the 4Q switch.

17. The system of claim 15, wherein the comparator is a Norton comparator.

18. The system of claim 15, wherein the resistive circuit comprises a series combination of a first resistor and a second resistor, wherein the first and the second resistors are equal in value.

19. The system of claim 15, wherein the current generator comprises a reference voltage source coupled in series to a resistor.

20. The system of claim 15, wherein the current generator comprises a bandgap current reference.

* * * * *